United States Patent [19]

Swaffield

[11] Patent Number: 5,410,257
[45] Date of Patent: Apr. 25, 1995

[54] ZERO INSERTION FORCE TEST/BURN-IN SOCKET

[75] Inventor: John D. Swaffield, Danvers, Mass.

[73] Assignee: Precision Connector Designs, Inc., Peabody, Mass.

[21] Appl. No.: 31,570

[22] Filed: Mar. 15, 1993

[51] Int. Cl.⁶ .................. G01R 31/02; H01R 13/62
[52] U.S. Cl. ............................... 324/755; 439/268
[58] Field of Search ............ 324/158 F, 158 P, 755, 324/754; 439/268

[56] References Cited

U.S. PATENT DOCUMENTS

| | | | |
|---|---|---|---|
| 3,848,221 | 11/1974 | Lee, Jr. | 324/158 F |
| 4,080,032 | 3/1978 | Cherian et al. | 439/268 |
| 4,350,402 | 9/1982 | Douty et al. | 439/268 |
| 5,213,531 | 5/1993 | Matsuoka et al. | 439/268 |

*Primary Examiner*—Ernest F. Karlsen
*Attorney, Agent, or Firm*—Jerry Cohen; Edwin H. Paul

[57] ABSTRACT

An IC test/burn-in socket with spring cantilever beam contacts and a lid 4 that provides for self-aligning of the IC lead and the socket contacts 6. The lid is actuated from above, and the lid has three positions—one for an unloaded socket, one for holding the contacts apart for insertion of an IC, and the other for releasing the contacts such the the spring force of the cantilever beam contacts make electrical contact with the IC leads. The cantilever contacts are arranged in interdigitated rows. The flat cantilever contacts allow the contacts to spread a substantial distance to achieve the desired contact force and will thus accommodate a wider range of IC lead thicknesses and, so, be more forgiving than earlier designs. There is a lid with troughs to guide the contacts and a through hole whereby an IC is inserted. The troughs and through hole provide improved registration of IC lead to socket contacts. The lid is accessed from above to enhance automatic operation and to reduce the footprint or space taken by the socket on a PCB.

6 Claims, 3 Drawing Sheets

ZERO INSERTION FORCE TEST/BURN-IN SOCKET

FIELD OF THE INVENTION

The present invention relates to integrated circuit sockets used to test and burn-in (test/burn-in) power/control and other types of integrated circuits (ICs). In particular, the present invention relates to zero-insertion force test/burn-in sockets suitable for automatic loading and unloading of ICs with minimal damage to the IC device leads.

BACKGROUND OF THE INVENTION

Examples of zero insertion force (ZIF) test sockets have been used in industry for many years. The requirement for zero insertion force arose to prevent damage to IC leads from the wiping action as the lead is forcefully inserted into socket contacts. Herein, IC is defined to include DIP, SIP and power hybrid in-line packages, e.g. T0-220 and similar such types. Burn-in is defined as monitored electrical operation of the IC, under elevated ambient temperature for a period of time, to screen out quality defective devices. This process is routinely done on virtually all ICs produced, and therefore automation of the process is desirable. Typical existing sockets have cam or other such mechanical actuators which deflect the socket contacts to allow an integrated circuit (IC) to be inserted without the IC leads wiping the contacts. The cam is then rotated to a closed position and the mechanical linkages provide the force to make electrical contact between the IC leads and the socket contacts. These linkages are unreliable, especially under the environmental extremes of high temperature IC burn-in.

To reduce IC costs, manufacturers plate the IC leads thinner (down to 4 microns) with such alloys as nickel-palladium. The plating is not rugged, and, thus, it is even more important to prevent damage to the IC leads.

Typically, the electrical connections between the test/burn-in socket contacts and the IC leads are made on that part of the IC lead which is soldered to a printed circuit board (PCB) in production assembly of the IC and, so, may damage the IC lead.

Some existing test/burn-in sockets will mechanically guide the IC leads with protrusions to place the IC in proper position for making electrical contact to the IC leads. These protrusions may damage the IC leads by stubbing and/or deflecting them. Thus, automated use of this socket requires precise registration between the loading device and the test socket.

Burn-in sockets for IC packages usually have flat blanked, stamped out contacts which are individually installed into the socket housing. In some such sockets the contacts are not within the same plane such that gang-mounting of connected contacts is precluded. Such an arrangement requires manual loading of each contact. These limitations have prevented the wide spread automation of assembly of test/burn-in sockets and their use.

The fact that some sockets have flat blanked, non-coplanar contacts also precludes automated selective plating; thus each contact must be plated all over with a precious metal such as gold.

Some existing test/burn-in sockets require contacts to have two or more tail configurations, in order to separate adjacent tails on the PCB, which must have a solder pad for each tail.

In test/burn-in sockets used with power ICs, the socket contacts must be heavy to accommodate the higher currents (up to several amps and more). These heavy contacts are stiff requiring high forces to open, and such contacts can only be forced open a short distance in order not to exceed the yield strength of the contact materials and permanently deform the contacts.

Another limitation of existing test/burn-in socket contacts is that they connect to one or both of the flat sides of an IC lead and require the socket contacts to be narrow enough to avoid shorting adjacent IC leads while still making reliable contact with the IC leads. One approach to solve this problem is to use the narrow edge of a flat stamped contact, but such an edge incurs sharp edges and other non-smooth surfaces which may damage the IC lead plating. The alignment must also be carefully controlled in such sockets. Another limitation of existing test/burn-in sockets is that their contacts are encased in slots of the dielectric housing material, thus restricting air flow over the contacts and impeding heat dissipation.

It is an object of this invention to improve reliability by reducing the mechanical linkages in ZIF test/burn-in sockets.

It is another object of this invention is to provide a test/burn-in socket wherein the IC leads are not contacted on that part of the IC lead which is soldered to a PCB.

It is a further object of this invention to provide for a test/burn-in socket wherein the IC leads are substantially untouched throughout a test/burn-in cycle including associated handling through drop-in mounting of the IC into the test socket with no mechanical guiding of the IC leads, and then to make electrical connections after such mounting.

It is an object of this invention to lower the cost of the socket by facilitating the use of selective gold plating.

It is still another object of this invention to provide improved registration between the IC leads and the socket contacts.

It is still a further object of this invention to improve assembly and to lower the cost of the socket by using only one contact tail configuration.

It is another object of the present invention to provide socket contacts which can be opened wide while allowing the high current required by power ICs, and wherein the wide opening also serves to improve the automatic loader positioning tolerance.

Another object of the present invention is to provide test contacts that require less accurate registration, and also a smoother contact surface.

It is an object of this invention to provide a socket with minimal encasement of its contacts in dielectric so as to maximize air circulation and thermal dissipation to enhance high current performance.

SUMMARY OF THE INVENTION

The foregoing objects are met with a test/burn-in socket having cantilevered spring beam contacts, wherein the spring provides the force between the socket contacts and the IC leads using no additional mechanical means. The socket, in a preferred embodiment, provides for a top mounted lid which can be lowered in the vertical direction (vertical herein defined as the longitudinal direction of an IC lead) with access to the lid from above the socket. When the lid is forced downwardly into the socket, means on the lid provide a force against the spring action of the cantilever beam socket contacts thereby driving the contacts apart to allow an IC to be inserted. The IC insertion requires substantially no force. The reduction of the force pushing the lid downwardly allows the socket contacts to spring back to make electrical contact with the IC leads. This spring action of the beam contacts also pushes the lid upwardly.

The cantilevered contacts, when not spread apart and with no IC mounted, are constructed in the socket to interdigitate with adjacent contacts. Interdigitate is defined herein to mean that each contact is in a position beyond that point where that contact would make electrical connection with the IC lead, and where the contacts, when driven apart, travel through that point, and such that when the spreading force is removed the contacts will electrically connect to IC leads at the contact point as the contacts attempt to return to their original positions. The cantilever construction allows these contacts to spread a substantial distance without damaging the contacts. The spring constant is small enough in the cantilever construction to allow a wider range of deflection to achieve the desire contact force and will thus accommodate a wider range of IC lead thicknesses and, so, be more forgiving than earlier designs.

The present invention provides a test/burn-in socket that is more forgiving of mis-alignment between the IC lead and the socket contacts than previous sockets.

Opposing electrical contacts are interdigitated, which means each contact makes electrical connection to alternating IC leads. This has the advantage of allowing the socket contacts to be wider than the IC leads for better registration, while also allowing greater spacing between the receiving pads on the the PCB to which the burn-in sockets are mounted. In addition, in a preferred embodiment, these larger contacts may have spring loads sufficient to break down oxides and other such insulating layers on the IC leads and so provide improved electrical connections.

The larger contacts also provide higher electrical current capability required by power ICs, through wider contact interface with the IC leads. The larger contacts also provide greater stability in the axis perpendicular to the axis of deflection, which allows the contact to be unsupported by housing material between the contacts, and thus allows air circulation which contributes to higher current capability.

In a preferred embodiment the lid is constructed with a through opening for inserting ICs, and the lid has troughs (or grooves) that guide the socket contacts to force compliance of the contacts to the troughs in the lid, thus providing positive registration between the lid and the socket contacts. An IC is inserted through the lid where the opening geometry controls the alignment of the IC leads to the lid. This "self-alignment" provides direct registration between the IC leads and the lid, and, via the lid troughs, to the socket contacts.

In another preferred embodiment, the lid is actuated by pushing and then releasing the lid from above the socket. With an IC inserted the lid can be in either of two vertical positions—the two positions being one above the other. This top-actuation arrangement accommodates automatic loading and unloading of the ICs, into and out of the socket, respectively. This top-actuation lid requires no extensions or arms that enlarge the footprint of the test/burn-in socket on a PCB, so, the present invention minimizes the footprint to allow a high density of test/burn-in sockets. This higher density results in faster testing and lower costs. Also, since the lid may be damaged by the automatic insertion equipment it can be replaced, thus increasing lifetime of the socket and reducing costs.

In a further preferred embodiment the socket is built with registration points to allow automatic insertion equipment to locate the test socket.

Other objects, features and advantages will be apparent from the following detailed description of preferred embodiments thereof taken in conjunction with the accompanying drawing in which:

DETAILED DESCRIPTION OF PREFERRED EMBODIMENTS

Figure 1:
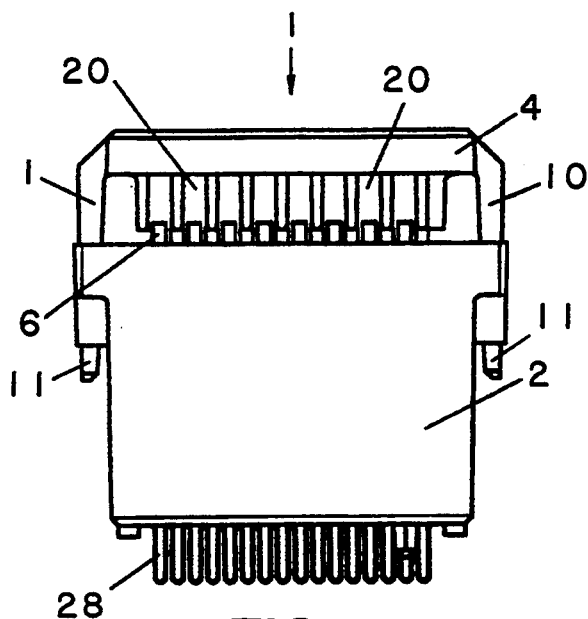
FIG. 1 is a side view of a preferred test/burn-in socket made in accordance with the present invention.

FIG. 1 shows a socket 1 made in accordance with the present invention. There is a generally rectangular housing 2, having a lid 4 movably connected therewith, and contacts 6 extending vertically in the housing. A socket with this number of contacts (16) is typical, but other sockets can be made with different numbers of contacts, e.g., 8, 12, 24, etc. without departing from the present invention. The housing 2 and lid 4 are both molded of a glass-filled polyetherimide thermoplastic resin, a material exhibiting high heat resistance. The lid 4 contains a fluoropolymer additive which contributes to the actuating mechanism operation by reducing friction. Lid 4 is arranged to move downwardly and upwardly with respect to the housing 2.

Figure 3:
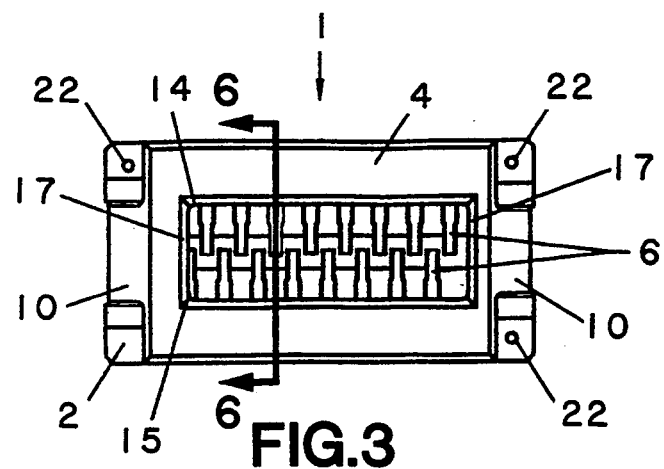
FIG. 3 is a top view of the socket of FIG. 1.

Referring to FIG. 3, the socket 1 has two rows of contacts 6 facing each other, but staggered to be interdigitated such that two adjacent contacts in one row would mate with every other SIP 8 lead. Thus, each SIP lead mates alternately with a contact 6 in one row and a contact 6 in the other row. In the unloaded position, shown in FIGS. 1-5, the rows of contacts 6 mesh together (interdigitate) without touching each other. This positioning is herein defined as the free state (under no separating force from an IC lead or the lid) of the contact beam. This free state position is designed such that when the beam contact 6 is in electrical connection with an IC lead the force on the IC lead is normal to the lead surface (see arrow 3 in FIG. 7).

Figure 5:
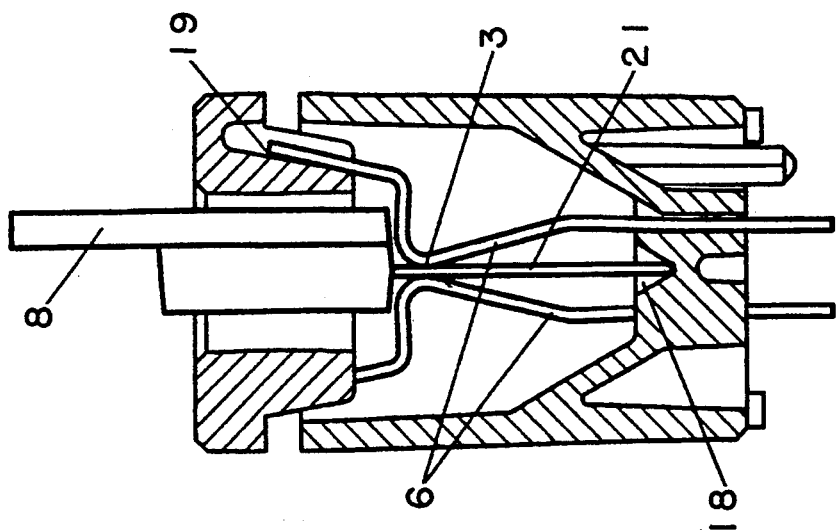
FIG. 5 is a cross section taken generally along the plane defined by reference line A—A of FIG. 3 and showing the lid in the up position.
Figure 6:
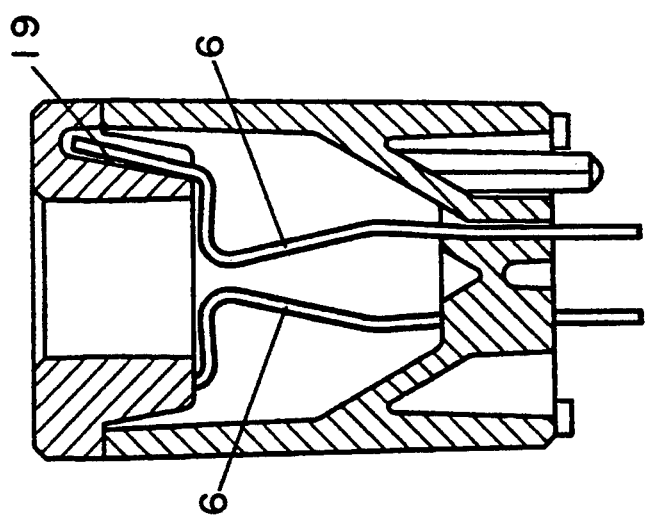
FIG. 6 is a cross section similar to FIG. 5 showing the lid in the down position.
Figure 7:
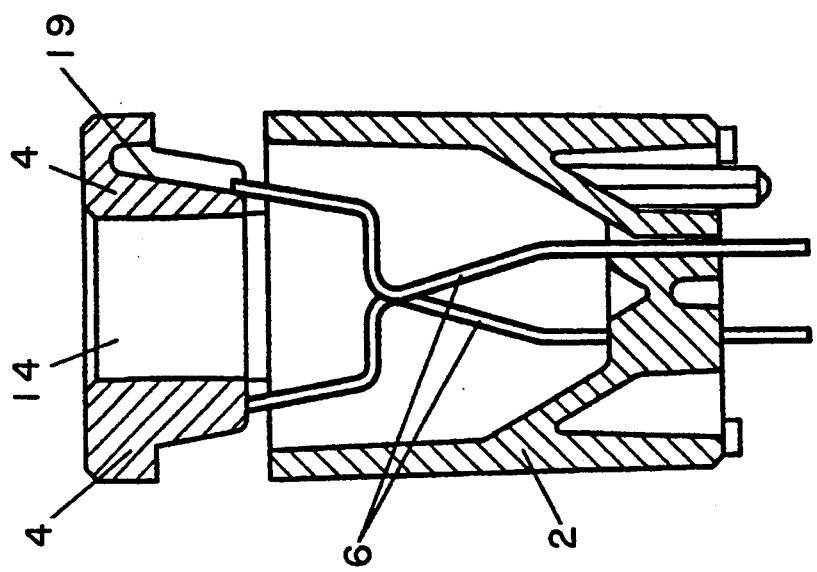
FIG. 7 is a cross section similar to FIG. 5 showing the socket loaded with a SIP.

As viewed in FIG. 2 the lid 4 is shown to have its two longer sides inclined downwardly and toward each other for a reason explained below. The lid 4 is movable between two extreme positions—up, as shown in FIG. 5, and down, as shown in FIG. 6. When the lid 4 is forced from the up to the down position the lid has a ramped extensions 19 forming troughs 20 along its longer sides. The extensions 19 and the troughs conform to the incline described above. The troughs underlie the tops of the contacts 6 when the lid 4 is in the up position, and force them away from each other when the lid is moved toward the down position. This leaves an opening between the contacts 6 allowing a SIP lead to be inserted as shown in FIG. 7. Referring to FIG. 7, when fully inserted the SIP leads 21 rest in a "vee" shaped channel 18 at the bottom of the housing 2 which centers the SIP itself with respect to the housing. The downward force on the lid 4 is then released and the contact springs force the lid upwardly. The contacts 6 make electrical connections between the SIP lead 21 and through the socket contacts to the PCB board.

The lid 4 has a rail 10 on each side extending downwardly with a flange 11 at its lower end. Each rail 10 is movable in a track 12 which extends outwardly from the ends of the housing and guides the movement of the lid 4 in its upward and downward movements. When in the up position the flanges 11 prevent the lid 4 from further upward travel, and with a SIP 8 mounted in the socket 1, the socket contacts 6 are allowed to spring together to make electrical contact with the SIP leads 6. The SIP 8 is removed by depressing the lid.

Referring to FIG. 1, the lid 4 is constructed with a through hole 14 for inserting SIPs (not shown) and the lid guides the contacts 6 in troughs 20 which position the contacts at known locations relative to the lid. Since the SIP is inserted through the lid 4, the geometry of the lid controls the alignment of the SIP leads to the socket contacts 6. This "self-alignment" between the SIP, lid 4 and contacts 6 ensures a repeatable, reliable connection between the SIP lead and the socket contacts.

The operation of the lid 4 is particularly adapted for use with automatic equipment that loads, tests and unloads SIP packages. There are also, as shown in FIG. 3, three loader alignment holes 22 asymetrically arranged to provide location and polarization for automatic loading equipment.

Figure 2:
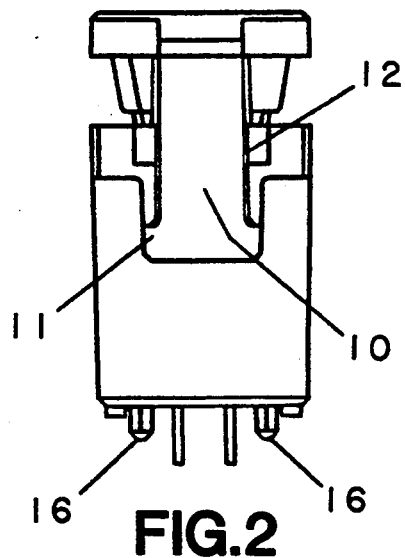
FIG. 2 is an end view of the socket of FIG. 1.

Referring to FIG. 2, to position the lid, rails 10 are provided which ride in the tracks 12 on the housing. These rails secure the lid to the housing. Referring to FIG. 3, the rails and tracks are polarized by rail 10 at one end being wider than rail 10 at the other end. Such polarization insures proper orientation of the lid 4 to the housing 2. This polarization is required because the rectangular opening 14 in the lid is off-center. The reason for this is that the SIP which is to be inserted through the opening has an odd number of leads (fifteen in this preferred embodiment), however, the socket has sixteen contacts. An even number is used to balance actuation forces and to aid assembly (the socket is assembled with two strips of eight contacts each). Thus, one end contact 15 (FIG. 3) serves no electrical purpose. The top of the lid 4 covers this contact so that the SIP (not shown) makes contact only with the other fifteen contacts. The ends 17 of the rectangular opening 14 position the SIP body relative to the lid 4 and thus to the socket contacts 6.

Figure 4:
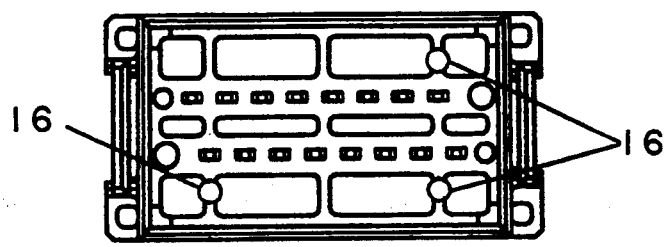
FIG. 4 is a bottom view of the socket of FIG. 1.

Referring to FIG. 4, the housing is also polarized to the PCB on which the socket is mounted by three asymetrically arranged posts 16 that will be inserted into corresponding holes in the PCB. This arrangement is required since the PCB has sixteen holes to accommodate the sixteen contact tails, but only fifteen will be used electrically.

Figure 8:
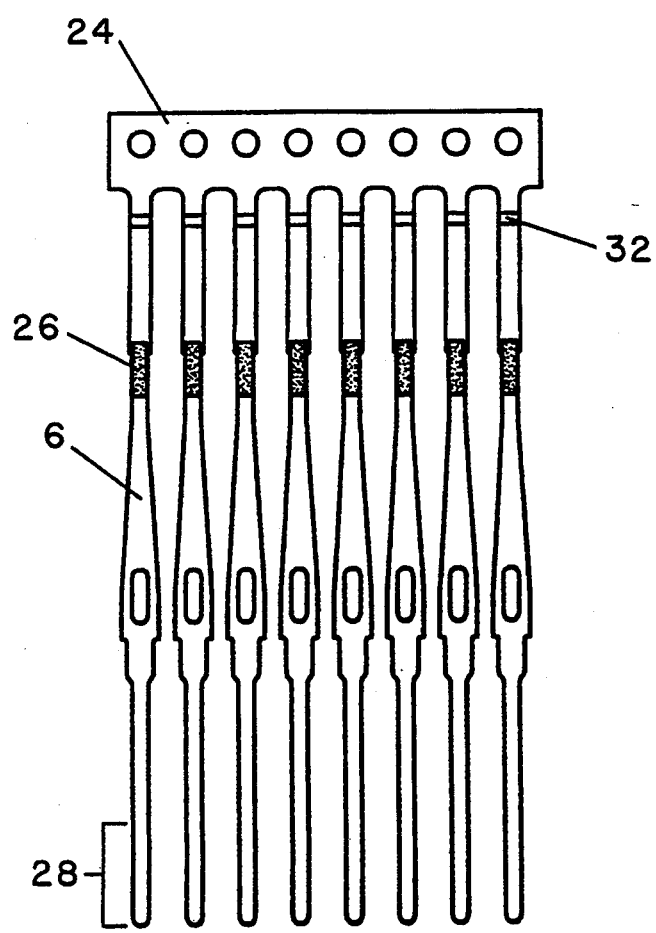
FIG. 8 is a front view of a contact strip.
Figure 9:
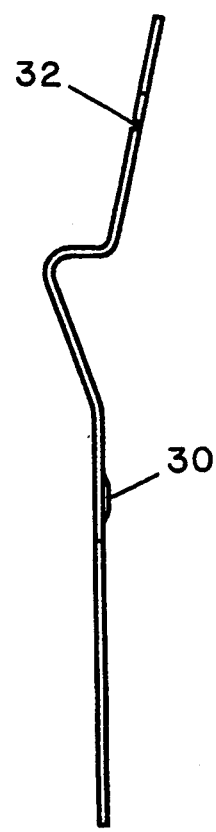
FIG. 9 is an end view of the contact strip of FIG. 8.

Referring to FIGS. 8 and 9, the electrical contacts 6 are a stamped copper-nickel alloy, and the contacts are formed in a progressive die to produce a continuous series of contacts connected together with a carrier strip 24. After formation the contacts are wound onto a metal reel and heat treated. The contacts are then plated via a continuous process. The contacts are nickel plated and gold is applied only at the contact point 26 saving cost.

The contacts are cut into strips which are loaded into the housing with the contacts still connected to each other via the carrier strip 24. Each contact 6 has a lengthened tail forming an extension 28 which is grasped in order to pull the contacts through and into the proper position in the housing. The contacts are designed with this extension so that the area being grasped (and possibly damaged) may be later trimmed off. As shown in FIG. 9, there is a raised portion 30 which when installed in the housing provides an interference fit between the contacts and the housing to secure the contact within the housing.

Still referring to FIG. 9, after the contacts are properly seated the tail extensions 28 are trimmed off and the carrier strip is broken away from the contacts. There is a score mark 32 where the contact meets the carrier to facilitate this breaking.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A test/burn-in socket for IC packages having leads defining longitudinal axes comprising:
   (a) housing means defining a contact chamber, said contact chamber arranged with a longitudinal dimension constructed to accept the IC leads,
   (b) spring contact means within the contact chamber, said contact means fixed relative to said housing means only along an axis parallel to the longitudinal axis of an IC lead,
   (c) a lid having a first position, said lid having an extension that spreads the contact means thereby allowing for inserting an IC with the IC leads not contacting the contact means, and a second position where the contact means make electrical connections to the IC leads by striking the IC leads with a force normal to the IC lead surface, and where said first position is disposed from said second position in a direction parallel with said longitudinal axes.

2. A socket as defined in claim 1 further wherein said lid has a through hole through which said IC passes, and wherein said contact means are arranged in opposing rows such that each adjacent IC lead makes electrical connection to a contact in opposite rows.

3. A socket as defined in claim 1 wherein the contact means are arranged and constructed to accommodate a DIP package.

4. A socket as defined in claim 1 wherein the contact means are arranged and constructed to accommodate a SIP or power IC package.

5. A socket as defined in claim 1 wherein the contact means are each arranged and constructed to make electrical contact with a corresponding IC lead sufficiently close to the IC package body such that the portion of the IC lead, distal from the package, meant to be soldered to a PCB is substantially untouched.

6. A socket as defined in claim 1 wherein the contact means are arranged and constructed such that with no IC mounted and with the contacts not spread apart the contacts are arranged and constructed at a position beyond the point where electrical contact to an IC lead would have been made.

* * * * *